United States Patent
Radjassamy

(10) Patent No.: US 7,313,177 B2
(45) Date of Patent: Dec. 25, 2007

(54) RESET SCHEME FOR I/O PADS IN A SOURCE SYNCHRONOUS SYSTEM

(75) Inventor: Rajakrishnan Radjassamy, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 830 days.

(21) Appl. No.: 10/622,672

(22) Filed: Jul. 18, 2003

(65) Prior Publication Data

US 2004/0223542 A1 Nov. 11, 2004

Related U.S. Application Data

(60) Provisional application No. 60/469,500, filed on May 10, 2003.

(51) Int. Cl.
*H04B 1/38* (2006.01)

(52) U.S. Cl. .................................................... 375/220

(58) Field of Classification Search ................ 375/257, 375/259, 285, 354, 377; 327/108, 141; 326/56
See application file for complete search history.

(56) References Cited

U.S. PATENT DOCUMENTS

| | | | | |
|---|---|---|---|---|
| 5,561,384 A | * | 10/1996 | Reents et al. | 327/108 |
| 5,850,546 A | * | 12/1998 | Kim | 713/1 |
| 5,887,040 A | | 3/1999 | Jung et al. | |
| 5,930,527 A | * | 7/1999 | Shin | 710/72 |
| 6,104,253 A | | 8/2000 | Hall et al. | |
| 6,199,135 B1 | | 3/2001 | Maahs et al. | |
| 6,236,249 B1 | * | 5/2001 | Choi et al. | 327/143 |
| 6,292,116 B1 | | 9/2001 | Wang et al. | |
| 6,628,564 B1 | * | 9/2003 | Takita et al. | 365/230.06 |
| 6,744,291 B2 | * | 6/2004 | Payne et al. | 327/143 |
| 6,839,570 B2 | * | 1/2005 | Hutchison et al. | 455/558 |

OTHER PUBLICATIONS

Affidavit of Richard W. Adkisson, Feb. 17, 2005, 4 pages.

\* cited by examiner

*Primary Examiner*—Khanh Tran

(57) ABSTRACT

A system and method for providing reset control between two integrated circuit domains (ICDs) disposed in a synchronous relationship. Upon reset, control signals are generated in a first ICD for resetting driver/receiver circuitry therein in a phased manner. An inter-ICD reset control signal is generated by the first ICD for transmission to the second ICD, wherein the inter-ICD reset control signal is operable to reset the second ICD's driver/receiver circuitry and other components therein.

24 Claims, 8 Drawing Sheets

RESET SCHEME FOR I/O PADS IN A SOURCE SYNCHRONOUS SYSTEM

PRIORITY UNDER 35 U.S.C. §119(e) & 37 C.F.R. §1.78

This nonprovisional application claims priority based upon the following prior United States provisional patent application entitled: "Reset Scheme In A Synchronous System," Application No.: 60/469,500, filed May 10, 2003, in the name(s) of Rajakrishnan Radjassamy, which is hereby incorporated by reference.

CROSS-REFERENCE TO RELATED APPLICATION(S)

This application discloses subject matter related to the subject matter disclosed in the following commonly owned co-pending U.S. patent application(s): (i) "Register-Based De-Skew System And Method For A Source Synchronous Receiver," application Ser. No. 10/376,390, filed Feb. 28, 2003, in the name(s) of: Rajakrishnan Radjassamy, and (ii) "System And Method For Establishing A Known Timing Relationship Between Two Clock Signals," application Ser. No. 10/376,835, filed Feb. 28, 2003, in the name(s) of: Rajakrishnan Radjassamy, which are hereby incorporated by reference in their entirety.

BACKGROUND

Digital electronic systems, e.g., computer systems, often comprise a number of circuit domains that need to communicate with one another using different interfaces, each running at an optimized speed for increased performance. Typically, multiple clock signals having related frequencies are utilized for providing appropriate timing to the interfaces. For instance, a clock signal with a particular frequency may be provided separately to two circuits that are physically spaced apart, wherein one circuit is operable to transmit data to the other. Further, where data is to be transferred at high rates between a transmitting circuit and a receiving circuit, a derived clock signal is also provided by the transmitting circuit via a separate trace such that data may be registered accurately at the receiving end using a local clock signal that is generated based on the transmitted clock signal (which may also be referred to as the transported clock signal). Usually, this transported clock signal is provided in addition to conventional data strobe signals generated towards the receiving circuit. In such applications, it would be necessary that the clock signal used for clocking out data towards the receiving circuit be disposed in a known relationship with the transported clock signal so that proper timing reference may be obtained for capturing the data.

Furthermore, where two circuit domains are disposed in a synchronous bi-directional communication relationship, it is necessary that the various clock signals, strobes, and data between the two domains be coordinated in a known manner for achieving proper operation. Of particular importance is the requirement that such circuit domains establish and maintain their synchronous operation even where they may be independently powered up, powered down or reset. There are no known mechanisms that address this requirement, however.

SUMMARY

A system and method for providing reset control between two integrated circuit domains (ICDs) disposed in a synchronous system are disclosed. In one embodiment, control signals are generated in a first ICD for resetting driver/receiver circuitry therein in a phased manner upon a system reset. An inter-ICD reset control signal is generated by the first ICD for transmission to the second ICD, wherein the inter-ICD reset control signal is operable to reset the second ICD's driver/receiver circuitry and other components therein.

DETAILED DESCRIPTION OF THE DRAWINGS

Figure 1:
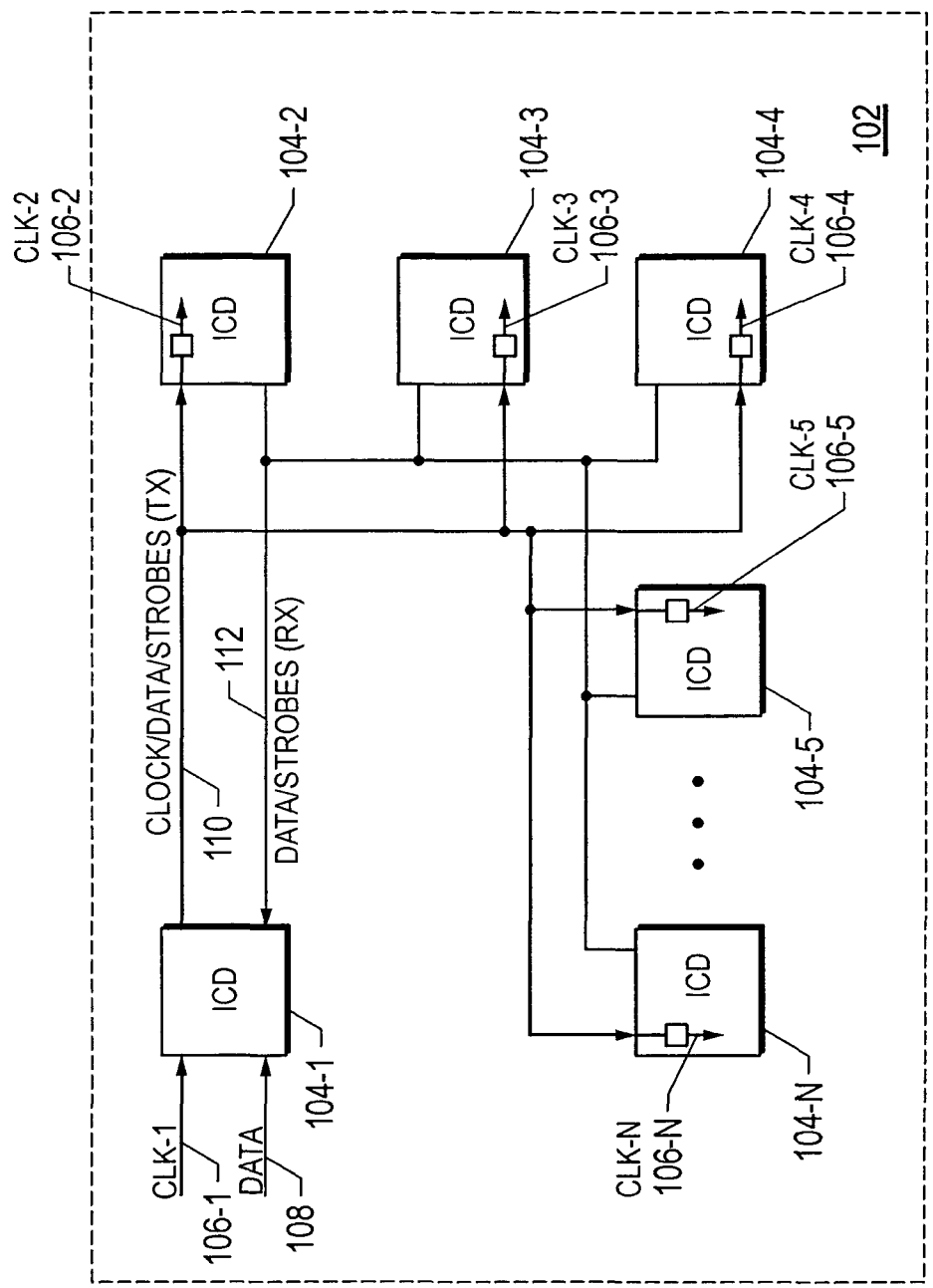
FIG. 1 depicts a functional block diagram of a digital electronic system embodiment where multiple integrated circuit domains (ICDs) disposed at different locations communicate with each other using clock and data signals having a synchronous relationship.

In the drawings, like or similar elements are designated with identical reference numerals throughout the several views thereof, and the various elements depicted are not necessarily drawn to scale. Referring now to FIG. 1, depicted therein is a functional block diagram of an exemplary digital electronic system 102 having multiple integrated circuit domains (ICDs) disposed at different locations in a synchronous relationship, wherein a circuit design embodiment of the present invention may be advantageously implemented for providing reset control in a phased manner. In one application, the electronic system 102 may comprise data transfer circuitry in a high-performance computer system such as a multiprocessor system, where data is efficiently transmitted from one source to a number of receiving entities in the system using synchronous signaling. Reference numerals 104-1 through 104-N refer to a plurality of ICDs that communicate with each other wherein data pulses are clocked out from a transmitting domain with a first clock signal, e.g., clock signal 106-1, that has a known timing relationship with a second clock signal that is transported to the receiving domains. Further, strobe signaling is also provided from the transmitting domain to the receiving domain(s) for effectuating high-speed data transfer operations. For instance, reference numeral 110 refers to the clock, data and strobe signals synchronously transmitted from ICD 104-1 to the remaining ICDs. Likewise, reference numeral 112 refers to the data and strobe signals transmitted to ICD 104-1 in the reverse direction.

In one implementation, ICD 104-1 is operable to receive data 108 from another domain external to the electronic system 102, wherein the data is clocked out using CLK-1 106-1 on a path that fans out to the remaining ICDs. Also, to synchronize data registration operations by the receiving ICDs that are disposed at variable distances with respect to the transmitting ICD 104-1, a transported clock signal is provided using a clock path that extends from ICD-1 104-1 to the remaining ICDs. Clock receiver circuitry in each receiving ICD uses the transported clock signal to manufacture its own internal clock signal that provides timing with respect to the various operations of its domain, e.g., data capture and cleanup, data processing by core circuitry, et cetera. In FIG. 1, reference numerals 106-2 through 106-N refer to the internal clock signals generated by the receiving ICDs that are derived from the transported clock signal, which is in a known timing relationship with CLK-1 106-1 used for clocking out data. Moreover, each ICD is also provided with circuitry for de-skewing the strobe signals received from the transmitting domain so as to compensate for any signal skew. Additional details regarding the generation of transported clock signals and de-skewing circuitry are provided in the following commonly owned co-pending U.S. patent applications: (i) "Register-Based De-Skew System And Method For A Source Synchronous Receiver," application Ser. No. 10/376,390, filed Feb. 28, 2003, in the name(s) of: Rajakrishnan Radjassamy, and (ii) "System And Method For Establishing A Known Timing Relationship Between Two Clock Signals," application Ser. No. 10/376,835, filed Feb. 28, 2003, in the name(s) of: Rajakrishnan Radjassamy, which have been cross-referenced hereinabove and incorporated by reference herein.

It should be recognized that in a synchronous bi-directional communication system exemplified by the electronic system embodiment 102, various drivers (e.g., clock/data/strobe drivers) in each domain must be capable of driving signals at appropriate times such that valid timing relationships among the signals are initialized and maintained even as stochastic events (e.g., resets) may occur from time to time. Moreover, as alluded to in the Background section of the present patent application, additional complications also arise due to the fact that the circuit domains may be independently powered up, powered down or reset.

Figure 2A:
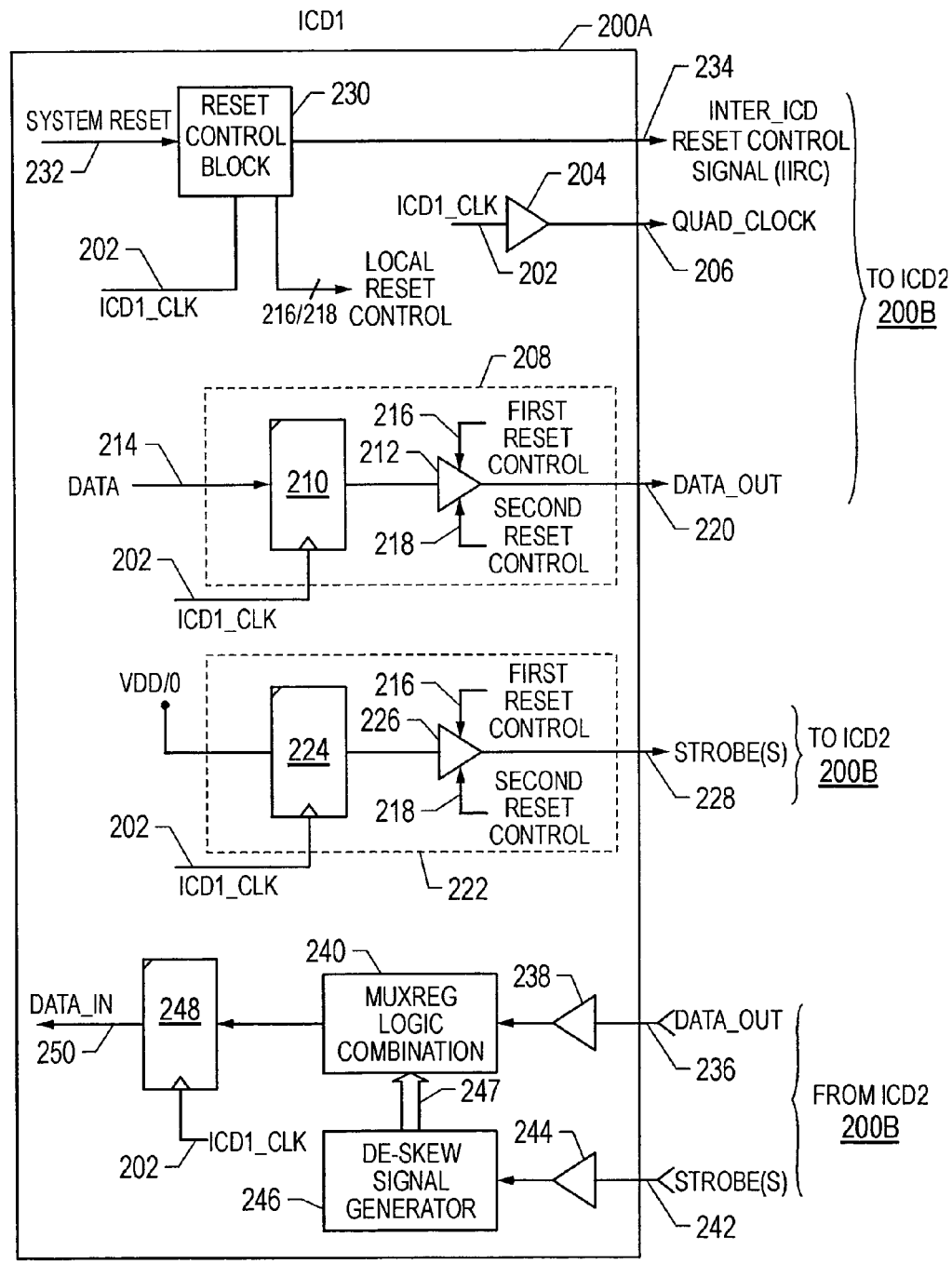
FIGS. 2A and 2B depict a pair of ICDs disposed in a synchronous relationship wherein an embodiment of a reset control system is provided.
Figure 2B:
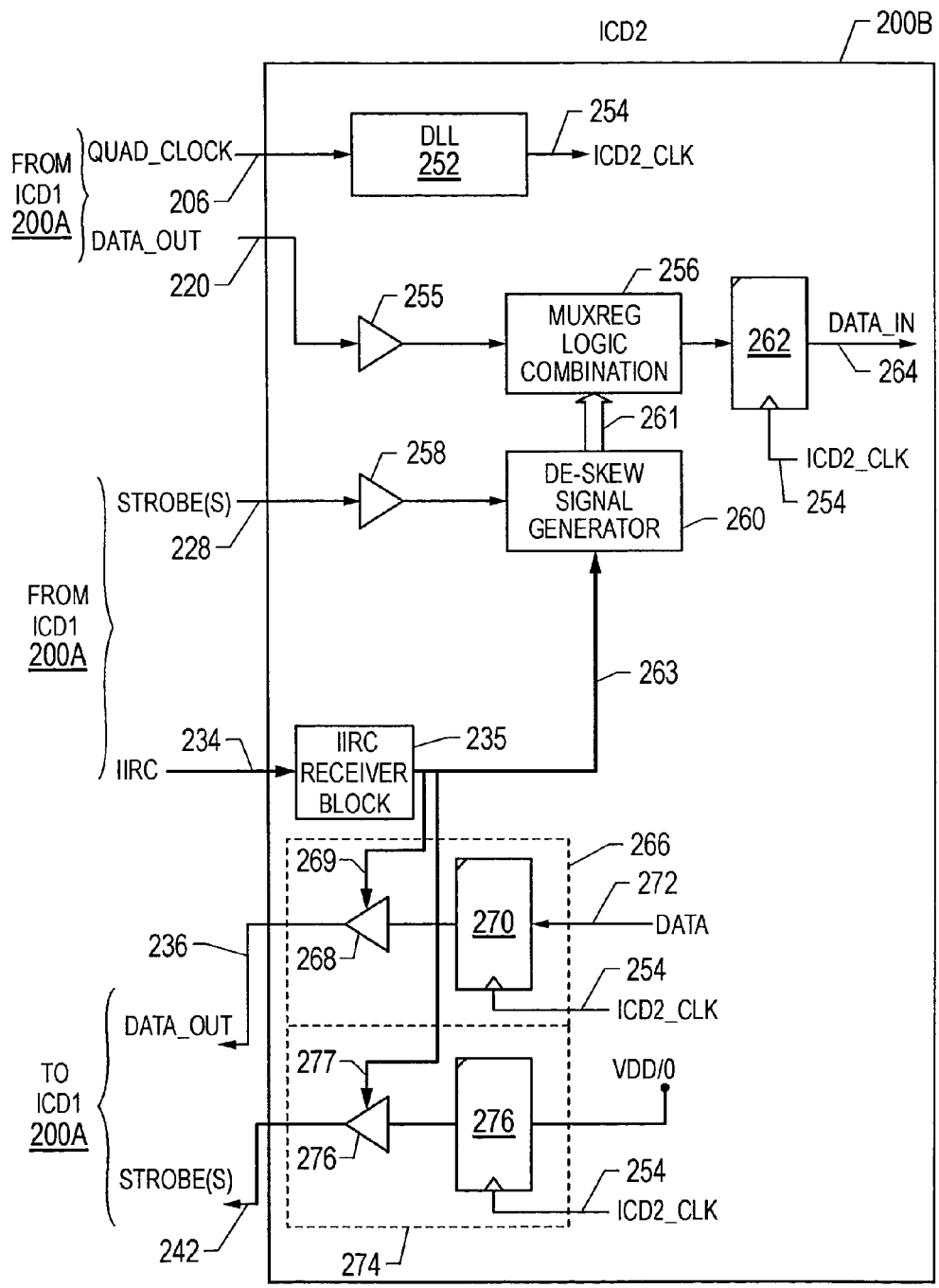

FIGS. 2A and 2B depict a pair of ICDs 200A and 200B exemplifying a source synchronous data transfer system wherein an embodiment of a reset control system of the present invention is implemented for providing reset control with respect to the input/output (I/O) pads of the driver/receiver circuitry therein. The ICDs, which can be a subset of the electronic system 102 described above, are operable together in a synchronous bi-directional communication relationship such that data and strobe signals may be transmitted from one ICD to the other once the driver circuitry of the ICDs is properly reset. Of the two ICDs, ICD1 200A may be deemed as the "master" since it coordinates the reset process between the two ICDs, in addition to transporting a clock signal to ICD2 to effectuate synchronicity.

The internal circuitry of ICD1 200A is clocked with a clock signal, ICD1_CLK 202, which may be generated using an external clock signal (e.g., a system clock signal) that is appropriately modified and conditioned by the ICD's clock distribution circuitry (not shown). A clock driver 204 is operable responsive to ICD1_CLK 202 for driving out a transported clock signal, QUAD_CLOCK 206, towards ICD2 200B. Data driver circuitry 208 operable to transmit data towards ICD2 200B is comprised of a register 210 for registering DATA 214 provided by ICD1, which is driven by a data driver 212 as DATA_OUT 220. As will be explained in greater detail hereinbelow, data driver 212 is operable to be reset in a phased manner under the control of a pair of reset control signals 216, 218 so as to ensure that data is transmitted only upon proper resetting of the circuitry of ICD2. Otherwise, the synchronous communication relationship between the two ICDs will be jeopardized, giving rise to invalid data in ICD2. Further, ICD1, ICD2, or both may be fatally damaged if the receiver circuitry therein is driven by the signals generated by driver circuitry in the corresponding counterpart ICD when the receiver circuitry is not properly powered up.

ICD1 200A is also provided with strobe circuitry 222 for generating appropriate strobe signal(s) towards ICD2 200B. A register 224 clocked with ICD1_CLK 202 provides strobe outputs to a strobe driver block 226 for driving out one or more strobe signals 228. As is the case with the data driver block 212, the strobe driver block 226 is also operable to be reset in a phased manner under the control of first and second reset control signals 216, 218 for establishing synchronicity upon a reset.

A reset control block 230 is operable responsive to a system reset signal 232 (which may have been generated pursuant to an external event, e.g., power-up, reset, et cetera) for providing a plurality of local reset control signals (e.g., first and second reset control signals 216, 218) that are variably timed for resetting ICD1's data and strobe drivers in a phased manner. In addition, the reset control block 230 also generates an inter-ICD reset control (IIRC) signal 234 that is transmitted to the receiving ICD, i.e., ICD2 200B, for triggering reset operations therein.

Referring now in particular to the receiving side of ICD2 200B (shown in FIG. 2B), the transported clock signal, i.e., QUAD_CLOCK 206, is provided to a delay logic loop (DLL) block 252 that conditions the received clock signal into an internal clock signal, ICD2_CLK 254, used for clocking ICD2's operations. Received data from ICD1, i.e., DATA_OUT 220, is provided to a multiplexer-register (MUXREG) logic combination block 256 via data buffer circuitry 255. Incoming strobe signals 228 are provided to a de-skew signal generator 260 via strobe buffer circuitry 258, which operates to de-skew the strobe signals so as to generate a plurality of de-skewed strobes 261. As explained in the following incorporated U.S. patent application, "Register-Based De-Skew System And Method For A Source Synchronous Receiver," application Ser. No. 10/376,390, filed Feb. 28, 2003, the de-skewed strobes 261 operate to control the MUXREG logic combination 256 for capturing the incoming data at appropriate times, which data is staged via a register block 262 as DATA-IN 264 provided to the internal circuitry of ICD2.

ICD2 200B is also provided with data driver circuitry 266 and strobe circuitry 274, both clocked with ICD2_CLK 254, for transmitting data and strobes to ICD1 200A in the opposite direction. Similar to the driver circuitry of ICD1 200A, the data driver circuitry 266 of ICD2 200B includes a register block 270 used for staging ICD2's data (DATA 272) that is driven by a data driver block 268 as DATA_OUT 236. Strobe circuitry 274 includes a register 276 that is clocked with ICD2_CLK 254 for providing strobe outputs to a strobe driver block 276, which drives out one or more strobe signals 242 towards ICD1 200A.

Referring again to ICD1 200A with respect to its receiver side, data as well as strobe(s) transmitted from ICD2 200B (i.e., DATA_OUT 236 and strobe signals 242) to ICD1 are provided to respective buffer circuits 238, 244 therein. Analogous to ICD2 200B, a de-skew strobe signal generator block 246 is provided in ICD1 200A for generating de-skewed strobes 247 used in conjunction with a MUXREG logic combination block 240 so as to accurately capture incoming data. A register block 248 is used staging the data, which is provided as DATA_IN 250 to the core circuitry of ICD1. Accordingly, it should be recognized that the strobe de-skew and data capture operations in ICD1 are essentially similar to the operations with respect to ICD2.

As pointed out earlier, IIRC signal 234 is transmitted from ICD1 200A to ICD2 200B to effectuate the resetting of ICD2's circuitry in coordination with the driver circuitry disposed in ICD1. Accordingly, an IIRC receiver block 235 disposed in ICD2 200B is operable to propagate, based on the received IIRC signal 234, one or more local reset control signals (e.g., signals 269, 277) to control the resetting of data and strobe drivers 268, 276, respectively. Further, the IIRC receiver block 235 is also operable to propagate a control signal 263 based on IIRC signal 234 towards the de-skew signal generator 260 so as to initiate ICD2's strobe de-skew operations.

Figure 3:
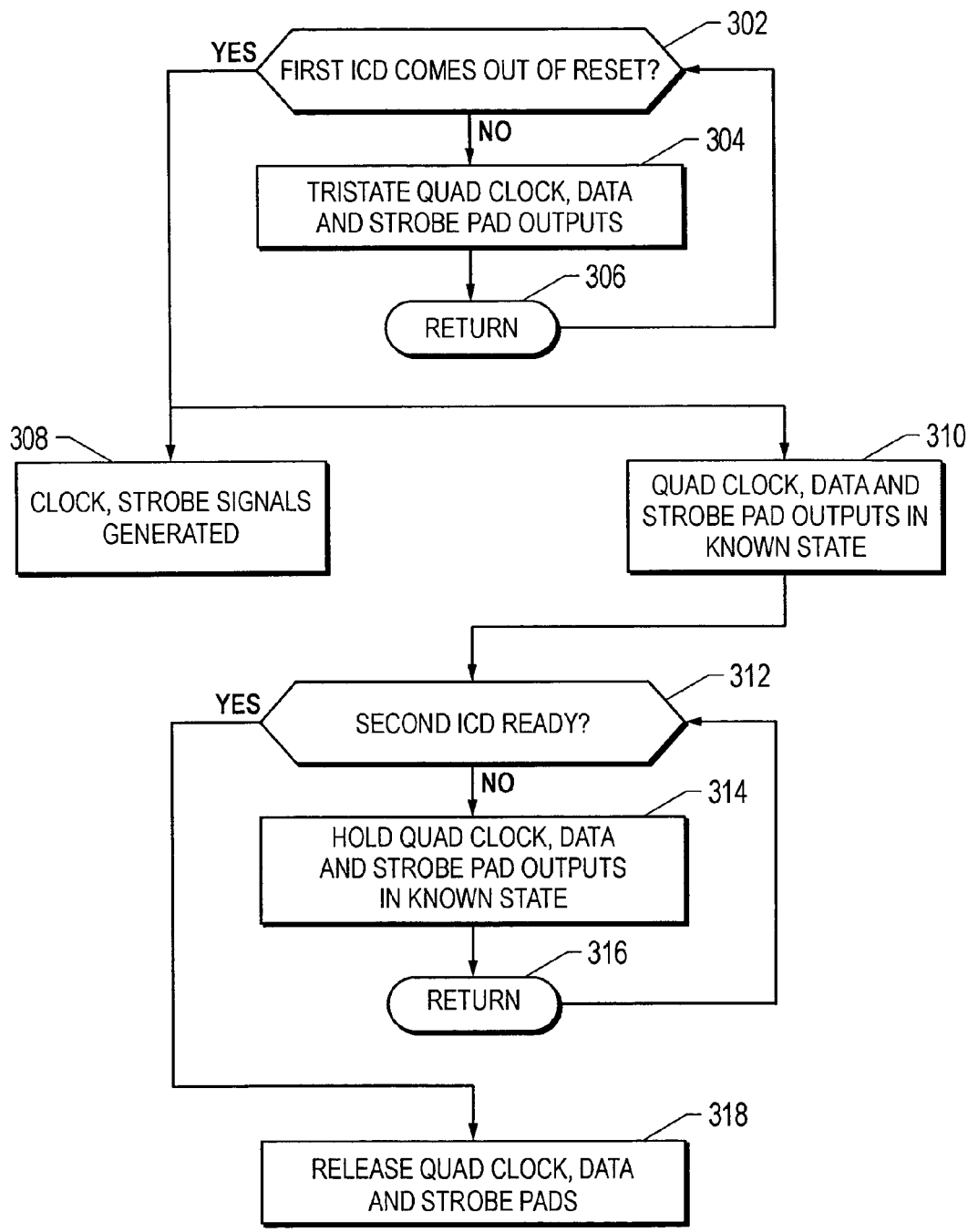
FIG. 3 depicts a flow chart of a set of operations involved in an embodiment of the present invention.

FIG. 3 depicts a flow chart of a set of operations involved in an embodiment of the present invention for providing reset control in a source synchronous system. Upon a system reset, an ICD (e.g., a first ICD) comes out of the reset due to a system-generated control signal (block 302). If the ICD hasn't been reset, the I/O pad outputs of the ICD are maintained in a tristated condition (block 304), which persists until the ICD comes out of reset (as exemplified by the RETURN block 306). Once the first ICD comes out of reset, its clock and strobe signals are generated by the appropriate circuitry therein (block 308). Also, the I/O pad driver outputs corresponding to QUAD_CLOCK, data and strobe signals are placed in a known state (block 310) ready for transmitting the signals. A verification is made as to whether a recipient ICD (e.g., a second ICD) is ready to receive the signals from the first ICD (decision block 312). In one embodiment, such verification may be made by ensuring that an amount of time (fixed or variable) has elapsed since the first ICD is rendered operable to generate the signals. If the second ICD is not ready for signal reception, the signal output pads of the first ICD are held in their known state (block 314). This condition is maintained (as exemplified by the return path in block 316) until the second ICD is rendered operable, i.e., taken out of reset. Thereafter, the signal output driver pads in the first ICD are released so that they can be activated for driving out the signals towards the recipient ICD (block 318). Accordingly, by resetting the driver pads in a phased and coordinated manner, synchronous operation of the two ICDs can be initialized properly.

Figure 4:
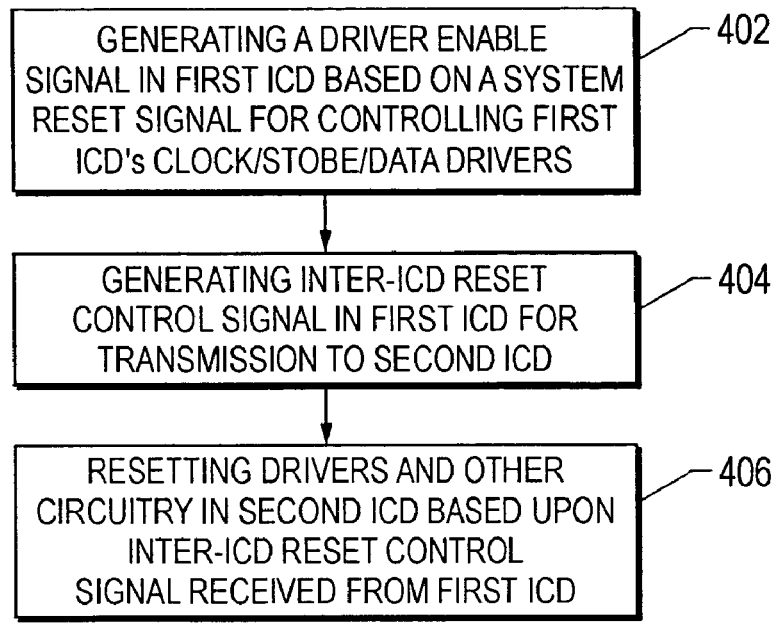
FIG. 4 depicts a flow chart of another set of operations involved in an embodiment of the present invention.

FIG. 4 depicts a flow chart of a set of operations for effectuating the phased reset control mechanism described above. Upon a system reset, a driver enable (DRV_EN) signal is generated in the first ICD based on a system reset signal for controlled release of the first ICD's drivers, e.g., transported clock, strobe and data drivers (block 402). An inter-domain control signal, i.e., the IIRC signal described hereinabove, is generated in the first ICD for transmission to the second ICD (block 404). Responsive thereto, driver circuitry and other circuitry in the second ICD are initialized, i.e., reset, whereby the circuitry becomes disposed to operate in coordination with the first ICD's circuitry in a synchronous manner (block 406).

Figure 5:
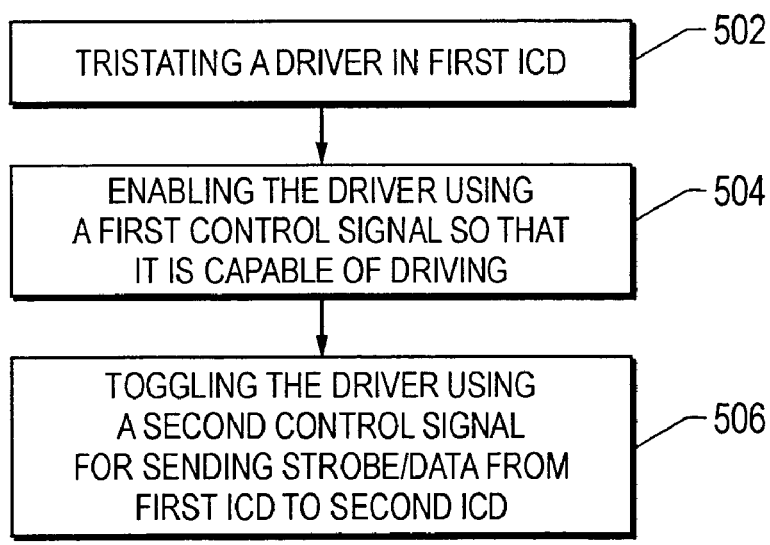
FIG. 5 depicts a flow chart of yet another set of operations involved in an embodiment of the present invention.

FIG. 5 depicts a flowchart of a set of operations for effectuating a two-step reset process in an ICD in accordance with an embodiment of the present invention. The ICD's driver circuitry is first tristated in a reset condition (block 502). Thereafter, the drivers are enabled by a first reset control signal such that they are capable of driving appropriate signals towards a recipient circuit domain (block 504). Upon application of a second reset control signal, the drivers are then toggled for sending strobe and/or data signals towards the recipient domain (block 506).

Figure 6:
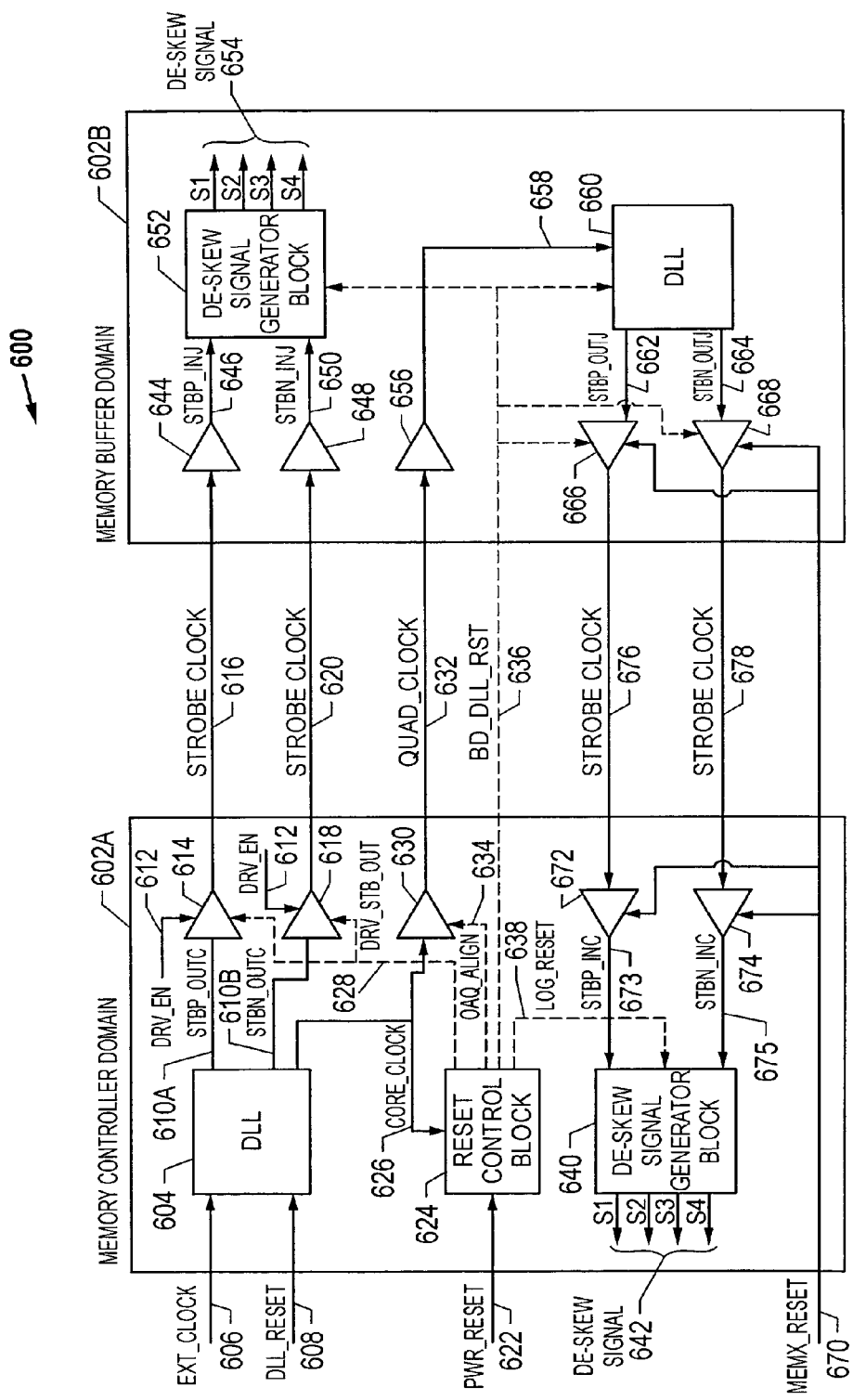
FIG. 6 depicts an exemplary memory system having reset control in accordance with an embodiment of the present invention.

FIG. 6 depicts an exemplary source synchronous memory system 600 having reset control in accordance with an embodiment of the present invention. The memory system 600 includes a memory controller domain (MCD) 602A and a memory buffer domain (MBD or BD, for short) 602B that are disposed in a source synchronous communication relationship for transmitting and receiving strobe and data signals therebetween. It should be readily recognized that the memory system 600 comprising MCD 602A and BD 602B is a particular embodiment of the synchronous system of ICD1 and ICD2 described in detail hereinabove. Accordingly, only certain salient features of the "closed-loop" synchronous communication path of the memory system 600 will be set forth below.

A DLL block 604 disposed in MCD 602A is operable responsive to an external clock signal 606 for generating a pair of complementary strobe output signals, STBP_OUTC 610A and STBN_OUTC 610B, that are provided to respective strobe drivers 614, 618 for transmission to BD 602B. Reference numerals 616 and 620 refer to the two strobe clock signals driven to BD 602B upon the phased resetting of the driver circuitry. The DLL block 604 is also operable to generate a local clock signal, referred to as MCD CORE_CLOCK 626, that is used for timing the MCD's operations. Further, the CORE_CLOCK signal 626 is utilized in generating a transported clock signal, QUAD_CLOCK 632, via a clock driver 630, for transmission to BD 602B.

With respect to the receive side of BD 602B, strobe buffers 644, 648 are operable to receive the strobe clock signals 616, 620, respectively, from MCD 602A in order to provide internal strobe inputs, STBP_INJ 646 and STBN_INJ 650. A de-skew signal generator 652 is operable to generate four one-hot de-skew strobe signals, S1-S4 654 based on the internal strobe inputs. A clock receiver buffer 656 is operable to condition the QUAD_CLOCK signal 632 to provide a local clock signal 658. With respect to the transmit side of BD 602B, a DLL block 660 disposed in BD 602B is operable responsive to the BD's local clock signal 658 for generating a pair of strobe signals, STBP_OUTJ 662 and STBN_OUTJ 664, which are provided to respective drivers 666 and 668 for driving out complementary strobe clock signals 676, 678 towards MCD 602A under reset control.

The receive side of MCD 602A includes a pair of strobe buffers 672, 674, for conditioning the strobe clocks 676, 678 received from BD 602B into a pair of complementary strobe inputs, STBP_INC 673 and STBN_INC 675, respectively. Similar to the strobe de-skewing functionality of BD 602B, a de-skew signal generator block 640 disposed in MCD 602A is operable to generate four de-skew strobe signals 642 based on STBP_INC 673 and STBN_INC 675.

To effectuate the phased reset control in the synchronous memory system 600, a pair of board-level system reset signals are utilized. A DLL_RESET signal 608 is provided to the DLL block 604 of MCD 602A for commencing the generation of the MCD strobe and clock signals after a known period of time. A DRV_EN control signal 612 based on DLL_RESET signal 608 is provided as a first reset control signal operable to control the drivers 614 and 618 so that they are taken out of their tristated condition. A PWR_RESET signal 622 is provided to a reset control block 624 for generating a plurality of control signals at appropriate times to coordinate the reset operation of the memory system 600. One of these control signals, DRV_STB_OUT signal 628, is provided as a second reset control signal with respect to the strobe drivers 614 and 618, so that the complementary strobe outputs, STBP_OUTC 610A and STBN_OUTC 610B, can be driven out as the strobe clocks 616, 620 towards BD 602B. Another control signal generated by the reset control block 624, referred to as OAQ_ALIGN signal 634, is provided to the clock driver circuitry 630 for controlling the transported clock signal generation. A LOG_RESET control signal 638 generated by the reset control block 624 is provided to the de-skew signal generator block 640 to control the generation of the S1-S4 de-skew strobes 642. Additional details regarding the production and operation of the OAQ_ALIGN control signal 634 and LOG_RESET control signal 638 may be found in the incorporated U.S. patent applications cross-referenced elsewhere in the instant patent application.

To coordinate the reset operation with BD 602B, the reset control block 624 of MCD 602A is also operable to generate an inter-domain reset control signal, BD_DLL_RST 636, for transmission to BD 602B at an appropriate time as will be described in detail below with reference to a timing diagram shown in FIG. 7. Upon reception in BD 602B, BD_DLL_RST control signal 636 is operable as a reset control signal with respect to the strobe driver circuitry 666, 668. In addition, BD_DLL_RST control signal 636 is also provided to the de-skew signal generator block 652 of BD 602B for controlling the generation of the S1-S4 de-skew strobes 665 therein.

Another system level control signal, MEMX_RESET 670, is provided to coordinate the transmission of the strobe signals from BD 602B to MCD 602A. In particular, the MEMX_RESET signal 670 is applied as a second reset control signal with respect to the strobe drivers 666, 668 in BD 602A. Further, the strobe buffers 672, 674 in MCD 602A are also controlled by the MEMX_RESET signal 670.

Figure 7:
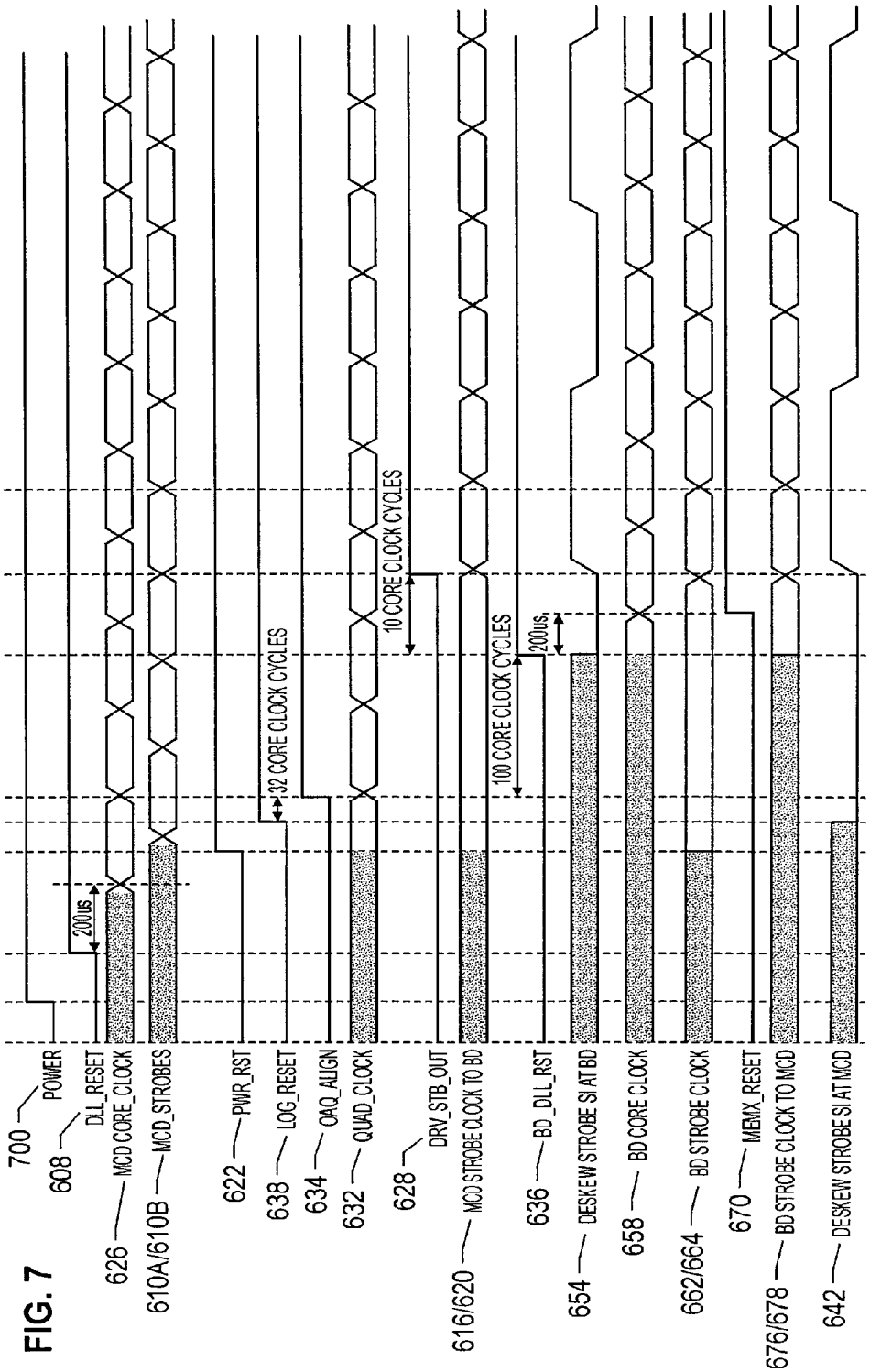
FIG. 7 depicts a timing diagram associated with the memory system shown in FIG. 6.

FIG. 7 depicts a timing diagram associated with the memory system shown in FIG. 6. Upon application of a power signal 700, DLL_RESET 608 is activated. About 200 µs later, MCD CORE_CLOCK 626 and strobe outputs 610A/610B are operable to be generated, although they are not yet driven out via their driver pads. Subsequently, PWR_RESET 622 is activated, which gives rise to LOG_RESET control signal 638 and OAQ_ALIGN control signal 634 (approximately 32 MCD core clocks cycles from LOG_RESET control signal 638). Responsive to OAQ_ALIGN control signal 634, QUAD_CLOCK signal 632 is generated for transmission from MCD 602A to BD 602B. Thereafter, the secondary reset control signal of MCD 602A, i.e., DRV_STB_OUT 628, is generated which, in turn, activates the driver circuitry to toggle the strobe clocks 616/620 out to the BD receiver circuitry.

About 100 MCD core clock cycles from the generation of OAQ_ALIGN control signal 634, BD_DLL_RST 636 is generated for transmission to BD 602B, which is used in generating de-skewed strobes 654 thereat. Based on the received QUAD_CLOCK signal 632, BD 602B generates its core clock signal, BD CORE_CLOCK 658 which, in turn, is utilized by the BD's DLL to manufacture the outgoing strobes 662/664. Responsive to the two reset controls, BD_DLL_RST 636 and MEMX_RESET 670, BD's strobe driver circuitry is placed in condition to drive out the complementary strobe clocks 676/678 to the MCD receiver circuitry.

Figure 8:
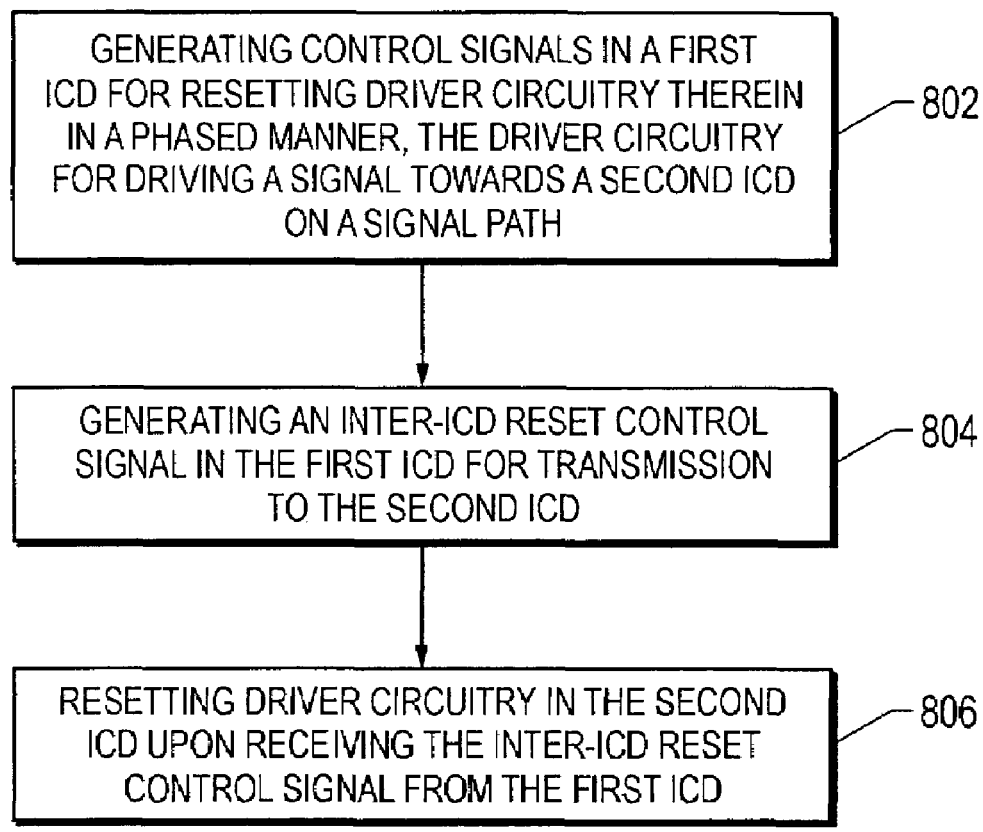
FIG. 8 depicts a flow chart of another set of operations involved in an embodiment of the present invention.

FIG. 8 depicts a flow chart of another set of operations involved in an embodiment of the present invention for providing reset control between two ICDs disposed in a synchronous relationship. At block 802, control signals are generated in a first ICD for resetting driver circuitry therein in a phased manner, where the driver circuitry is operable to drive a signal towards a second ICD on a signal path. At block 804, an inter-ICD reset control signal is generated in the first ICD for transmission to the second ICD. Thereafter, driver circuitry in the second ICD is reset based upon receiving the inter-ICD reset control signal from the first ICD (block 806).

Based on the foregoing Detailed Description, it should be appreciated that the reset control embodiment of the present invention advantageously provides for a phased and coordinated release of driver circuitry in both transmitting and receiving domains so that synchronous operations may be established and maintained even where there is delay between the powering up of the domains. Known timing relationships are established upon reset between the transported clock, strobe and data signals in order to ensure that the receiving domain is in operable condition for properly registering the incoming data, whereby data transfer errors can be avoided even in high-speed data transmission applications.

Although the aforesaid Detailed Description has been set forth with reference to certain illustrations, it is to be understood that the forms of the invention shown and described are to be treated as exemplary embodiments only. For instance, various logic modules, control signals and their logic levels illustrated in the FIGURES of the present patent application may be implemented using a number of different electronic devices and/or gate combinations, with any level of integration. Further, although the reset control of strobe driver circuitry has been particularly exemplified in some of the FIGURES, it should be apparent that data driver circuitry may also be similarly controlled upon a reset. Moreover, since bi-directional circuitry may be employed in a data transfer system, pad driver circuitry may comprise both driver as well as receiver circuitry. Accordingly, various changes, substitutions and modifications can be realized without departing from the spirit and scope of the invention as defined by the appended claims.

What is claimed is:

1. A method for providing reset control between two integrated circuit domains (ICDs) disposed in a synchronous relationship, comprising:
   generating control signals in a first ICD for resetting driver circuitry therein in a phased manner, said driver circuitry for driving a signal towards a second ICD on a signal path;
   generating an inter-ICD reset control signal in said first ICD for transmission to said second ICD; and
   resetting driver circuitry in said second ICD upon receiving said inter-ICD reset control signal from said first ICD.

2. The method for providing reset control between two ICDs disposed in a synchronous relationship as set forth in claim 1, wherein said driver circuitry in said first ICD is reset in a phased manner by providing first and second control signals, wherein said driver circuitry drives said signal towards said second ICD only after said first and second control signals have been asserted.

3. The method for providing reset control between two ICDs disposed in a synchronous relationship as set forth in claim 1, wherein said driver circuitry in said first ICD is reset in a phased manner by providing two control signals thereto, a first control signal operating to release said driver circuitry from a tristated condition and a second control signal operating to toggle said driver circuitry for driving appropriate logic levels with respect to said signal towards said second ICD.

4. The method for providing reset control between two ICDs disposed in a synchronous relationship as set forth in claim 3, wherein said driver circuitry in said first ICD is operable to drive a strobe signal towards said second ICD.

5. The method for providing reset control between two ICDs disposed in a synchronous relationship as set forth in claim 3, wherein said driver circuitry in said first ICD is operable to drive a data signal towards said second ICD.

6. The method for providing reset control between two ICDs disposed in a synchronous relationship as set forth in claim 3, wherein said first control signal is generated based on a system reset signal.

7. The method for providing reset control between two ICDs disposed in a synchronous relationship as set forth in claim 6, wherein said second control signal is generated by a reset control block disposed in said first ICD, said reset control block operating responsive to a power reset signal.

8. The method for providing reset control between two ICDs disposed in a synchronous relationship as set forth in claim 1, wherein said second ICD includes clock distribution circuitry for manufacturing a local clock signal based on a transported clock signal provided by said first ICD.

9. A system for providing reset control between two integrated circuit domains (ICDs) disposed in a synchronous relationship, comprising:
   circuitry that produces control signals in a first ICD to reset driver circuitry therein in a phased manner, said driver circuitry driving a signal towards a second ICD on a signal path; and
   circuitry that produces an inter-ICD reset control signal in said first ICD that is transmitted to said second ICD, said inter-ICD reset control signal operating to reset driver circuitry in said second ICD.

10. The system for providing reset control between two ICDs disposed in a synchronous relationship as set forth in claim 9, wherein said driver circuitry in said first ICD is reset in a phased manner by providing first and second control signals, wherein said driver circuitry drives said signal towards said second ICD only after said first and second control signals have been asserted.

11. The system for providing reset control between two ICDs disposed in a synchronous relationship as set forth in claim 9, wherein said driver circuitry in said first ICD is reset in a phased manner by providing two control signals thereto, a first control signal operating to release said driver circuitry from a tristated condition and a second control signal operating to toggle said driver circuitry for driving appropriate logic levels with respect to said signal towards said second ICD.

12. The system for providing reset control between two ICDs disposed in a synchronous relationship as set forth in claim 11, wherein said driver circuitry in said first ICD is operable to drive a strobe signal towards said second ICD.

13. The system for providing reset control between two ICDs disposed in a synchronous relationship as set forth in claim 11, wherein said driver circuitry in said first ICD is operable to drive a data signal towards said second ICD.

14. The system for providing reset control between two ICDs disposed in a synchronous relationship as set forth in claim 11, wherein said first control signal is generated based on a system reset signal.

15. The system for providing reset control between two ICDs disposed in a synchronous relationship as set forth in claim 14, wherein said second control signal is generated responsive to a power reset signal.

16. The system for providing reset control between two ICDs disposed in a synchronous relationship as set forth in claim 9, wherein said second ICD includes clock distribution circuitry for manufacturing a local clock signal based on a transported clock signal provided by said first ICD.

17. A computer system having at least two integrated circuit domains (ICDs) disposed therein in a synchronous communication relationship, comprising:
   means for generating control signals in a first ICD for resetting driver circuitry therein in a phased manner, said driver circuitry for driving a signal towards a second ICD on a signal path; and
   means for generating an inter-ICD reset control signal in said first ICD for transmission to said second ICD, said inter ICD reset control signal operating to reset driver circuitry in said second ICD.

18. The computer system as set forth in claim 17, wherein said driver circuitry in said first ICD is reset in a phased manner by providing two control signals thereto, a first control signal operating to release said driver circuitry from a tristated condition and a second control signal operating to toggle said driver circuitry for driving appropriate logic levels with respect to said signal towards said second ICD.

19. The computer system as set forth in claim 18, wherein said driver circuitry in said first ICD is operable to drive a strobe signal towards said second ICD.

20. The computer system as set forth in claim 18, wherein said driver circuitry in said first ICD is operable to drive a data signal towards said second ICD.

21. The computer system as set forth in claim 18, wherein said first control signal is generated based on a system reset signal.

22. The computer system as set forth in claim 21, wherein said second control signal is generated responsive to a power reset signal.

23. The computer system as set forth in claim 17, wherein said second ICD includes clock distribution circuitry for manufacturing a local clock signal based on a transported clock signal provided by said first ICD.

24. The computer system as set forth in claim 23, wherein said local clock signal in said second ICD is operable to activate a strobe generation block disposed therein for generating a strobe signal towards said first ICD.

* * * * *

UNITED STATES PATENT AND TRADEMARK OFFICE
CERTIFICATE OF CORRECTION

| | |
|---|---|
| PATENT NO. | : 7,313,177 B2 |
| APPLICATION NO. | : 10/622672 |
| DATED | : December 25, 2007 |
| INVENTOR(S) | : Rajakrishnan Radjassamy |

Page 1 of 1

It is certified that error appears in the above-identified patent and that said Letters Patent is hereby corrected as shown below:

Column 10, line 26, in Claim 17, delete "inter ICD" and insert -- inter-ICD --, therefor.

Signed and Sealed this

Eighth Day of April, 2008

JON W. DUDAS
*Director of the United States Patent and Trademark Office*